(12) United States Patent
Kadoguchi et al.

(10) Patent No.: US 10,546,760 B2
(45) Date of Patent: Jan. 28, 2020

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Takuya Kadoguchi, Toyota (JP); Yuuji Hanaki, Nagoya (JP); Atsuko Yamanaka, Toyota (JP); Shou Funano, Toyota (JP); Satoshi Takahagi, Nagakute (JP); Shingo Iwasaki, Nisshin (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/037,694

(22) Filed: Jul. 17, 2018

(65) Prior Publication Data

US 2019/0027381 A1    Jan. 24, 2019

(30) Foreign Application Priority Data

Jul. 19, 2017  (JP) ................................ 2017-140186

(51) Int. Cl.
*H01L 21/56* (2006.01)
*H01L 25/00* (2006.01)
*H01L 25/07* (2006.01)
*H01L 25/18* (2006.01)
(Continued)

(52) U.S. Cl.
CPC .......... *H01L 21/565* (2013.01); *H01L 23/367* (2013.01); *H01L 25/072* (2013.01); *H01L 25/18* (2013.01); *H01L 25/50* (2013.01); *H01L 24/32* (2013.01); *H01L 24/33* (2013.01);
(Continued)

(58) Field of Classification Search
CPC ...................................... H01L 21/565
See application file for complete search history.

(56) References Cited

U.S. PATENT DOCUMENTS 5,367,766 A * 11/1994 Burns ................... H01L 21/565
235/488
6,444,498 B1 * 9/2002 Huang .................. H01L 21/561
257/706
(Continued)

FOREIGN PATENT DOCUMENTS

JP    2007073583    3/2007
JP    2009302281    12/2009

*Primary Examiner* — David A Zarneke
(74) *Attorney, Agent, or Firm* — Hunton Andrews Kurth LLP

(57) ABSTRACT

A method of manufacturing a semiconductor device that includes a resin package sealing a semiconductor element and a pair of metal plates interposing the semiconductor element therebetween, in which each of the pair of metal plates is exposed at corresponding one of both surfaces of the resin package is disclosed. The method may include preparing an assembly in which the semiconductor element is connected to the pair of metal plates; setting the assembly in a cavity of a mold, wherein one metal plate is in contact with a bottom surface of the cavity and a space is provided above the other metal plate; forming the resin package by injecting a molten resin into the cavity so as to cover an upper side of the other metal plate, stopping the injecting of the molten resin with a part of the space on an upper side of the cavity unfilled.

3 Claims, 9 Drawing Sheets

(51) Int. Cl.
*H01L 23/367* (2006.01)
*H01L 23/00* (2006.01)
(52) U.S. Cl.
CPC ............... *H01L 2224/32245* (2013.01); *H01L 2224/33181* (2013.01)

(56) References Cited

U.S. PATENT DOCUMENTS

| | | | | |
|---|---|---|---|---|
| 6,951,776 | B2* | 10/2005 | Lo | H01L 21/561 |
| | | | | 257/E21.504 |
| 7,129,119 | B2* | 10/2006 | Lin | H01L 21/4846 |
| | | | | 438/113 |
| 7,164,210 | B2* | 1/2007 | Tsai | H01L 23/3128 |
| | | | | 257/796 |
| 7,405,107 | B2* | 7/2008 | Nakazawa | H01L 21/565 |
| | | | | 257/796 |
| 7,671,466 | B2* | 3/2010 | Pu | H01L 23/3157 |
| | | | | 257/707 |
| 2017/0141050 | A1* | 5/2017 | Jang | H01L 23/13 |
| 2018/0175011 | A1* | 6/2018 | Sung | H01L 25/18 |
| 2018/0269181 | A1* | 9/2018 | Yang | H01L 25/0655 |

* cited by examiner

METHOD OF MANUFACTURING SEMICONDUCTOR DEVICE

CROSS-REFERENCE TO RELATED APPLICATION

This application claims priority to Japanese Patent Application No. 2017-140186 filed on Jul. 19, 2017, the contents of which are hereby incorporated by reference into the present application.

TECHNICAL FIELD

A technique disclosed herein discloses a method of manufacturing a semiconductor device that includes a resin package sealing a semiconductor element and a pair of metal plates interposing the semiconductor element therebetween, in which each of the pair of metal plates is exposed at corresponding one of both surfaces of the resin package. The metal plates function as heat dissipating plates configured to dissipate heat of the semiconductor element.

BACKGROUND

The above-described semiconductor device is manufactured according to a following method. Firstly, an assembly including the semiconductor element and the pair of metal plates is prepared. Next, the assembly is set in a cavity of a mold configured to form the resin package. In the cavity, one metal plate of the pair of metal plates is in contact with a bottom surface of the cavity and the other metal plate of the pair of metal plates is in contact with an upper surface of the cavity. When resin is injected into the cavity, the assembly interposed between the bottom surface and the upper surface of the cavity thermally expands, and the semiconductor element interposed between the pair of metal plates may be damaged by being pressed. Therefore, the assembly is set in a state where one metal plate of the pair of metal plates is in contact with the bottom surface of the cavity and a space is ensured above the other metal plate of the pair of metal plates. Then, the cavity is filled with molten resin. The space above the other metal plate is also filled with the molten resin in the cavity. The other metal plate expands upward, and thus the semiconductor element is not pressed.

Solidified resin (the resin package) is extracted from the mold. The one metal plate which was in contact with the bottom surface of the cavity is exposed at the resin package, whereas the other metal plate is covered with the resin. Then, a surface of the resin package is removed to expose the other metal plate. Such a manufacturing method is described, for example, in Japanese Patent Application Publication No. 2007-73583 and in Japanese Patent Application Publication No. 2009-302281.

SUMMARY

When a whole of a cavity is completely filled with resin, it becomes less likely for gas bubbles in the molten resin to escape, as a result of which the gas bubbles may remain within a resin package. The disclosure herein provides a method of manufacturing a semiconductor device that includes a resin package sealing a semiconductor element therein, in which gas bubbles are less likely to remain in the resin package as compared to conventional techniques.

The disclosure herein discloses a method of manufacturing a semiconductor device that comprises a resin package sealing a semiconductor element and a pair of metal plates interposing the semiconductor element therebetween. Each of the pair of metal plates is exposed at corresponding one of both surfaces of the resin package. The method may comprise preparing an assembly in which the semiconductor element is connected to the pair of metal plates; setting the assembly in a cavity of a mold configured to form the resin package, wherein one metal plate of the pair of metal plates is in contact with a bottom surface of the cavity and a space is provided above the other metal plate of the pair of metal plates; forming the resin package by injecting a molten resin into the cavity so as to cover an upper side of the other metal plate, stopping the injecting of the molten resin with a part of the space on an upper side of the cavity unfilled, and hardening the molten resin injected into the cavity; and removing a resin covering the other metal plate.

A reason why it becomes less likely for gas bubbles in molten resin to escape therefrom when a whole cavity is filled with the resin is considered as because the molten resin becomes less mobile in the cavity and the gas bubbles do not reach a gas releasing hole (air vent). When the whole cavity is completely filled with the resin, a flow of the resin is disturbed especially in a last part to be filled with the resin, and gas bubbles are likely to remain in that part. In the manufacturing method disclosed herein, the injection of resin is stopped with a space above the molten resin in the cavity unfilled. Due to this, the "disturbed resin flow in the last phase of cavity fill", which occurs when the cavity is completely filled with the resin, does not occur and gas bubbles are less likely to remain. Further, the molten resin moves easily because an upper surface thereof is in contact with the space. As a result, gas bubbles in the molten resin also move easily and escape from a gas releasing hole provided in the cavity.

A recess may be provided in an area of an upper surface of the cavity, and the area may face the other metal plate. The forming of the resin package may comprise stopping the injecting of the molten resin with a part of an inner space of the recess unfilled. In other words, the injecting of the molten resin is stopped in a state where a part of the recess is filled with the molten resin. A height of the molten resin is lower around the recess. When the molten resin is injected, it flows into the recess from around the recess, and gas bubbles are likely to gather into an inside of the recess. As a result, it becomes less likely for gas bubbles to stay in the resin. Further, gas bubbles staying in the resin portion that covers the other metal plate are later removed together with that resin portion, and thus they do not remain in the resin package. Since a surface of the resin covering the other metal plate is not in contact with the mold when the molten resin solidifies, its flatness may be deteriorated. However, the resin portion covering the other metal plate is removed later, and thus its flatness is not problematic.

The manufacturing method disclosed herein may further comprise following features. The assembly may comprise two pairs of metal plates, and each of the two pairs of metal plates interposes a semiconductor element therebetween. A first joint may extend from an edge of a lower metal plate of one pair of the two pairs of metal plates, and a second joint may extend from an edge of an upper metal plate of the other pair of the two pairs of metal plates. The first joint and the second joint may overlap each other in a normal direction of the metal plates, and the first joint and the second joint may be connected to each other via a solder. In the cavity, the second joint may be in contact with an upper surface of the cavity. In the cavity, a metal portion constituted of the first and second joints and the solder is interposed between the bottom surface and the upper surface of the cavity. Therefore, the assembly is firmly held in the mold, and is not moved upon the resin injection.

Details of the technique disclosed herein and further improvements thereof will be described in DETAILED DESCRIPTION below.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

Figure 1:
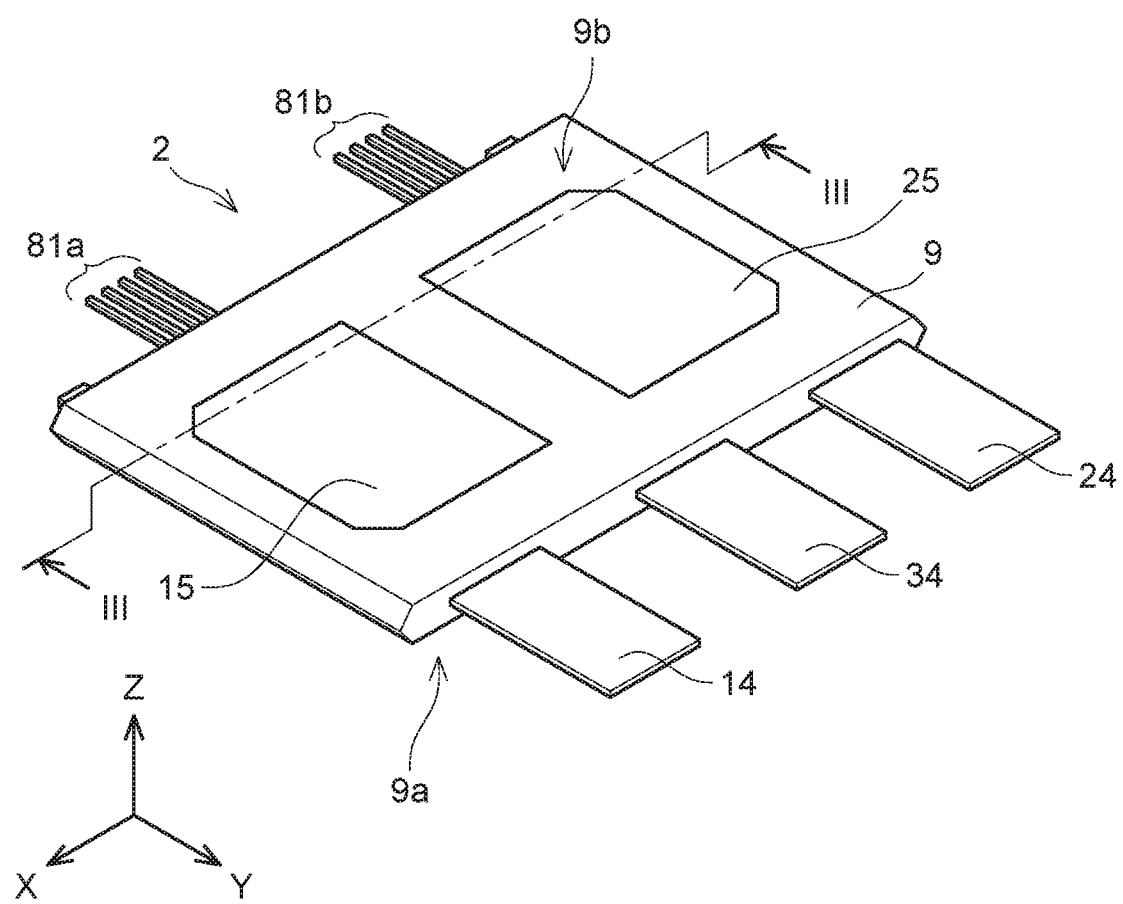
FIG. 1 is a perspective view of a semiconductor device 2 of an embodiment.
Figure 2:
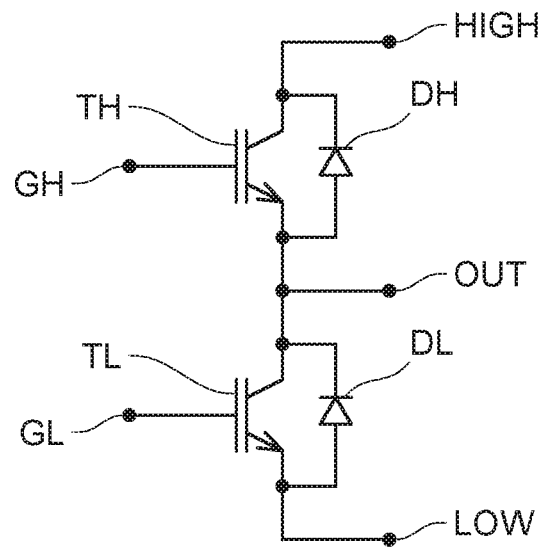
FIG. 2 is an electrical circuit diagram of the semiconductor device 2.

A semiconductor device 2 of an embodiment will be described with reference to the drawings. FIG. 1 shows a perspective view of the semiconductor device 2. The semiconductor device 2 is a device in which four semiconductor elements are sealed by a resin package 9. FIG. 2 shows an electrical circuit diagram in the package 9. The electrical circuit of the semiconductor device 2 is constituted of two transistors TH, TL and two diodes DH, DL. The two transistors TH, TL and the two diodes DH, DL all belong to power semiconductor element and are used mainly for power conversion. The semiconductor device 2 is typically used in an inverter configured to supply power to a driving motor in an electric vehicle, a hybrid vehicle, a fuel cell vehicle, or the like.

The two transistors TH, TL are connected in series. The diode DH is connected in antiparallel with the transistor TH, and the diode DL is connected in antiparallel with the transistor TL. For the sake of explanatory expedience, among terminals at both ends of the series connection, one terminal will be termed a HIGH terminal, and the other terminal will be termed a LOW terminal. Further, a midpoint of the series connection will be termed an OUT terminal. A P-terminal 14 in FIG. 1 corresponds to the HIGH terminal, an N-terminal 34 in FIG. 1 corresponds to the LOW terminal, and an O-terminal 24 in FIG. 1 corresponds to the OUT terminal. Further, a gate terminal GH of the transistor TH corresponds to one of control terminals 81a in FIG. 1. A gate terminal GL of the transistor TL corresponds to one of control terminals 81b in FIG. 1. Remaining terminals of the control terminals 81a, 81b are signal terminals for monitoring states of the semiconductor elements, and the like.

As shown in FIG. 1, metal plates 15, 25 are exposed at a surface 9b of the package 9. One surface of the metal plate 15 is exposed at the surface 9b of the package 9, and another surface of the metal plate 15 is electrically connected to a first transistor element 3 and a first diode element 4 (to be described later) within the package 9. One surface of the metal plate 25 is exposed at the surface 9b of the package 9, and another surface of the metal plate 25 is electrically connected to a second transistor element 5 and a second diode element 6 (to be described later) within the package 9. Although hidden to be seen in FIG. 1, two metal plates 12, 22 are also exposed at another surface 9a of the package 9. The metal plates 12, 15 are provided to dissipate heat from the first transistor element 3 and the first diode element 4. The metal plates 22, 25 are provided to dissipate heat from the second transistor element 5 and the second diode element 6. Next, a configuration inside the package 9, including the metal plates 12, 22, will be described.

For the sake of explanatory expedience, a positive direction on a Z-axis in a coordinate system shown in the drawings will be termed "upper", and a negative direction on the Z-axis will be termed "lower". These expressions of "upper" and "lower" may be used for other drawings.

Figure 3:
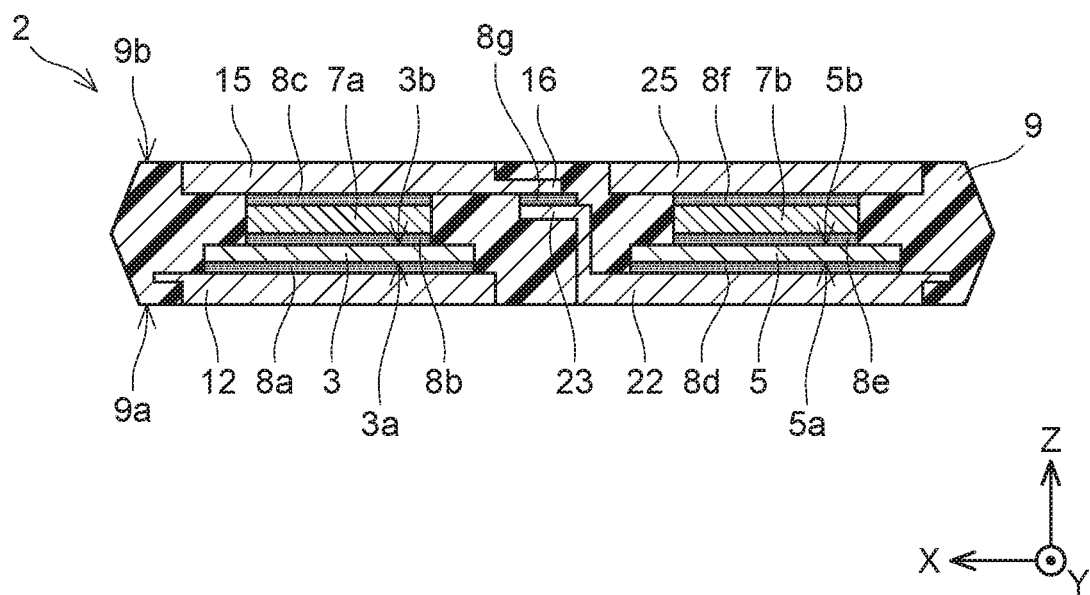
FIG. 3 is a cross sectional view along a line III-III in FIG. 1.

FIG. 3 shows a cross sectional view of the semiconductor device 2 along a line III-III in FIG. 1. The first transistor element 3 is interposed between a pair of the metal plates 12, 15. Although not shown in the cross sectional view of FIG. 3, the first diode element 4 is also interposed between the pair of the metal plates 12, 15. The first transistor element 3 has a flat-plate shape, and includes electrodes arranged respectively on its both surfaces. A collector electrode 3a is arranged on a lower surface of the first transistor element 3, and an emitter electrode 3b is arranged on an upper surface thereof. Further, a gate electrode and other signal electrodes are also arranged on the upper surface of the first transistor element 3.

The collector electrode 3*a* of the first transistor element 3 is connected to the metal plate 12 by a solder layer 8*a*. The emitter electrode 3*b* of the first transistor element 3 is connected to a lower surface of a spacer 7*a* by a solder layer 8*b*. The spacer 7*a* is constituted of copper and has electrical conductivity. An upper surface of the spacer 7*a* is connected to the metal plate 15 by a solder layer 8*c*. Although not shown in FIG. 1, as aforementioned, the first diode element 4 is also interposed between the pair of the metal plates 12, 15. A cathode electrode of the first diode element 4 is connected to the metal plate 12, and an anode electrode thereof is connected to the metal plate 15. The first transistor element 3 and the first diode element 4 are connected in antiparallel with each other between the pair of the metal plates 12, 15.

A collector electrode 5*a* is arranged on a lower surface of the second transistor element 5, and an emitter electrode 5*b* is arranged on an upper surface thereof. Further, a gate electrode and other signal electrodes are also arranged on the upper surface of the second transistor element 5. The collector electrode 5*a* of the second transistor element 5 is connected to the metal plate 22 by a solder layer 8*d*. The emitter electrode 5*b* of the second transistor element 5 is connected to a lower surface of a spacer 7*b* by a solder layer 8*e*. An upper surface of the spacer 7*b* is connected to the metal plate 25 by a solder layer 8*f*. Although not shown in FIG. 1, as aforementioned, the second diode element 6 is also interposed between the pair of the metal plates 22, 25. A cathode electrode of the second diode element 6 is connected to the metal plate 22, and an anode electrode thereof is connected to the metal plate 25. The second transistor element 5 and the second diode element 6 are connected in antiparallel with each other between the pair of the metal plates 22, 25.

A joint 16 extends from an edge of the metal plate 15, and a joint 23 extends from an edge of the metal plate 22. The joint 16 and the joint 23 are connected by a solder layer 8*g* within the package 9. The metal plate 15 and the metal plate 22 are electrically connected to each other by the joint 16 and the joint 23 being connected. That is, the first transistor element 3 and the second transistor element 5 are connected in series. The first transistor element 3 corresponds to the transistor TH in FIG. 2, and the first diode element 4 corresponds to the diode DH in FIG. 2. The second transistor element 5 corresponds to the transistor TL in FIG. 2, and the second diode element 6 corresponds to the diode DL in FIG. 2. The metal plate 12 corresponds to the HIGH terminal in FIG. 2, the metal plate 25 corresponds to the LOW terminal in FIG. 2, and the metal plates 15, 22 correspond to the OUT terminal in FIG. 2. The metal plate 12 is continuous with the P-terminal 14 in FIG. 1 and the metal plate 22 is continuous with the O-terminal 24 in FIG. 1, which will be described later. The metal plate 25 is connected to the N-terminal 34 in FIG. 1.

The semiconductor device 2 includes two pairs of the metal plates (a pair of the metal plates 12, 15, and a pair of the metal plates 22, 25). As aforementioned, the metal plates 15, 25 are exposed at the surface 9*b* of the package 9, and the metal plates 12, 22 are exposed at the other surface 9*a* thereof. The semiconductor elements 3, 4 (the semiconductor elements 5, 6) are interposed between the pair of the metal plates 12, 15 (the pair of the metal plates 22, 25) that are opposed to each other. The semiconductor elements 3, 4 (the semiconductor elements 5, 6) are sealed in the package 9 between the pair of the metal plates 12, 15 (the pair of the metal plates 22, 25). Next, a method of manufacturing the semiconductor device 2 will be described with reference to FIGS. 4 to 10.

Figure 4:
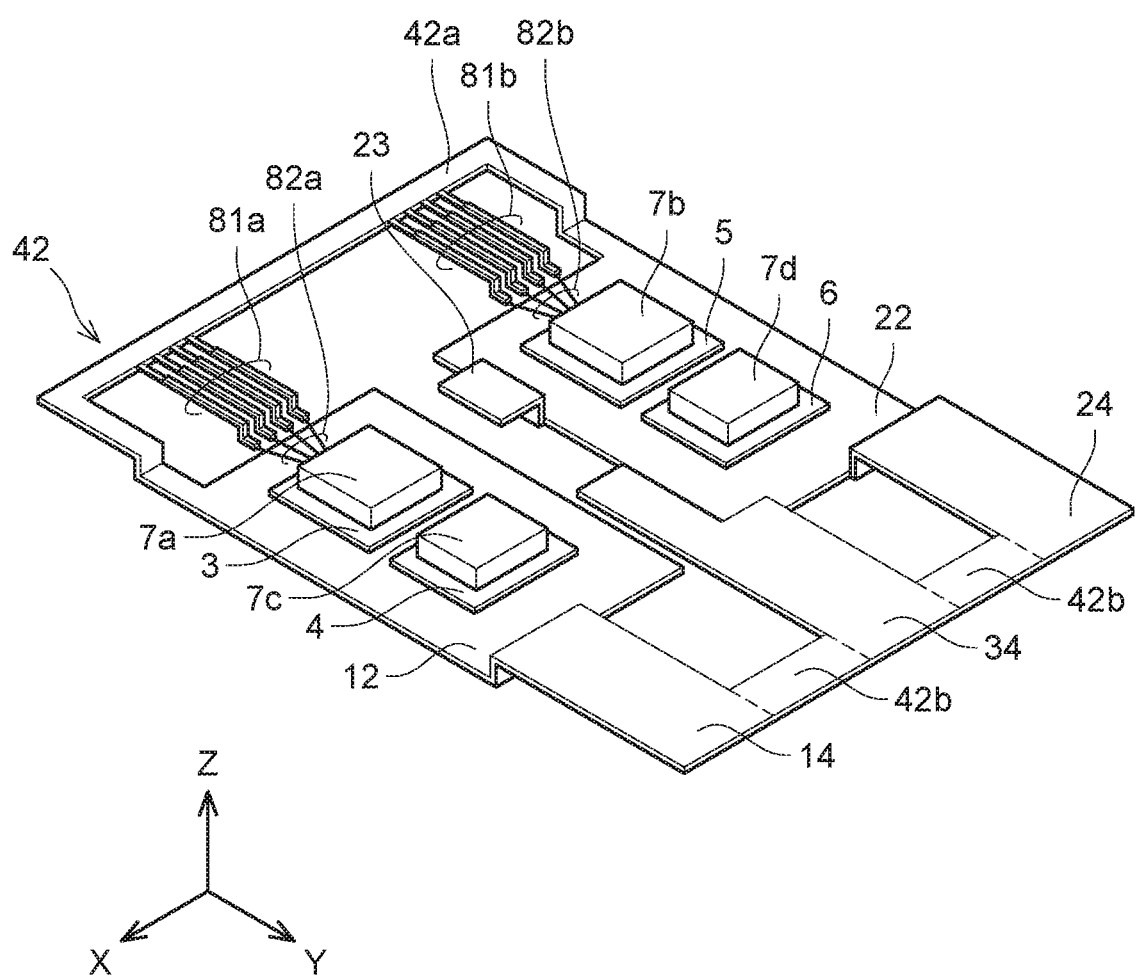
FIG. 4 is a perspective view of a lead frame 42.

(Preparing Process) In this process, a pair of metal plates interposing a semiconductor element therebetween is prepared. FIG. 4 shows a perspective view of the metal plates 12, 22 to which the first transistor element 3, the first diode element 4, the second transistor element 5, and the second diode element 6 are connected. The metal plates 12, 22, the P-terminal 14, the O-terminal 24, the N-terminal 34, and the control terminals 81*a*, 81*b* are a continuous metal plate at first. This continuous metal plate will be termed a lead frame 42. The lead frame 42 is obtained by machining a single metal plate with a press machine. Runner portions 42*a*, 42*b* of the lead fine 42 are to be removed later.

The lead frame 42 is prepared, and then the first transistor element 3 and the first diode element 4 are connected onto the metal plate 12. As aforementioned, the collector electrode 3*a* on the lower surface of the first transistor element 3 is connected to the metal plate 12. The cathode electrode on the lower surface of the first diode element 4 is connected to the metal plate 12. The upper surface (the emitter electrode 3*b*) of the first transistor element 3 is connected to the spacer 7*a*, and the upper surface (the anode electrode) of the first diode element 4 is connected to a spacer 7*c*. Similarly, the second transistor element 5 and the second diode element 6 are connected onto the metal plate 22. The collector electrode 5*a* on the lower surface of the second transistor element 5 is connected to the metal plate 22. The cathode electrode on the lower surface of the second diode element 6 is connected to the metal plate 22. The upper surface (the emitter electrode 5*b*) of the second transistor element 5 is connected to the spacer 7*b*, and the upper surface (the anode electrode) of the second diode element 6 is connected to a spacer 7*d*. Further, each of the plurality of control terminals 81*a* is connected to corresponding one of the signal electrodes (not shown) on the upper surface of the first transistor element 3 by a bonding wire 82*a*. Each of the plurality of control terminals 81*b* is connected to corresponding one of the signal terminals (not shown) on the upper surface of the second transistor element 5 by a bonding wire 82*b*.

Figure 5:
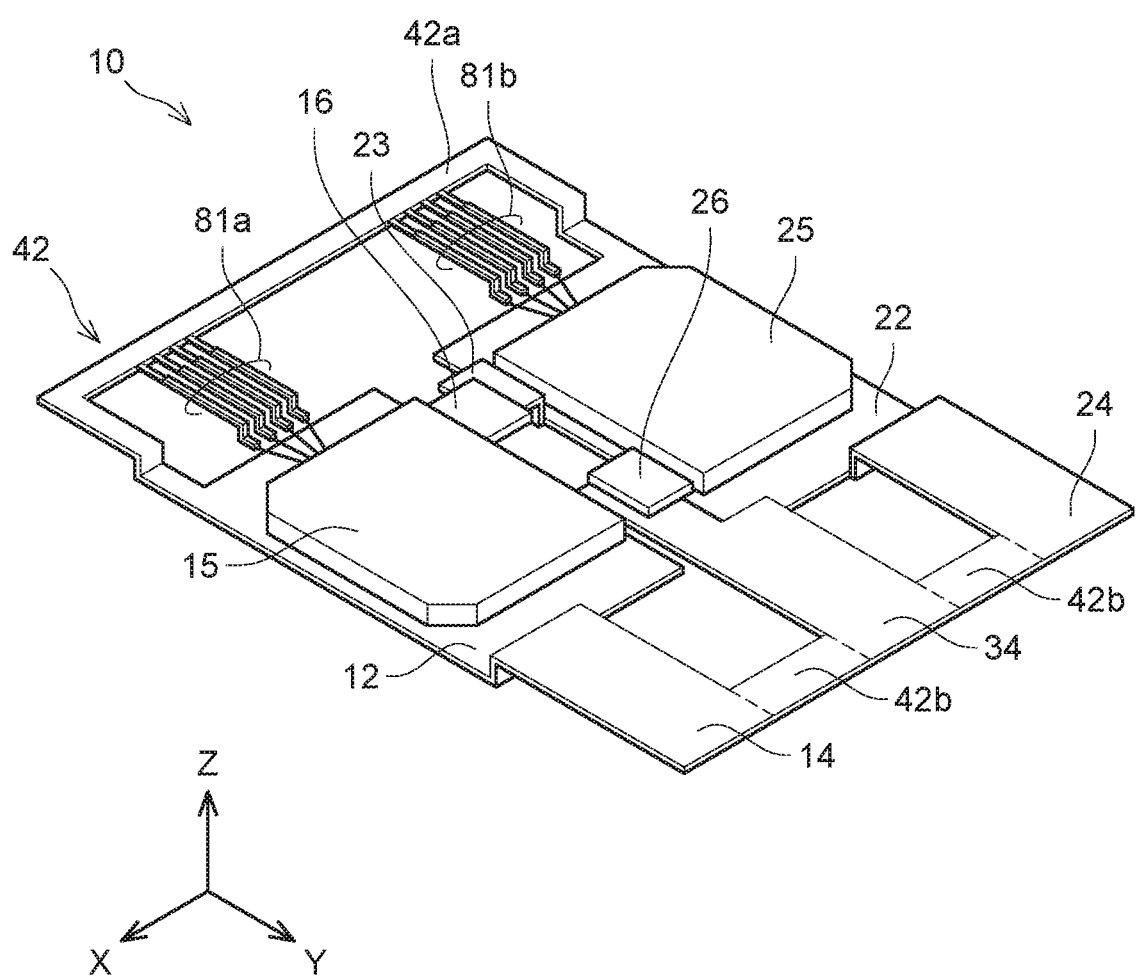
FIG. 5 is a perspective view of an assembly 10 including a semiconductor element and metal plates.

The metal plate 15 is connected onto the spacers 7*a*, 7*c*, and the metal plate 25 is connected onto the spacers 7*b*, 7*d* (FIG. 5). The joint 23 extends from the edge of the metal plate 22, and the joint 16 extends from the edge of the metal plate 15. The joints 16, 23 are arranged so as to overlap each other in a normal direction of the metal plate 22 (in a Z-direction in the drawings). As having been described with reference to FIG. 3, the joints 16, 23 are connected to each other by the solder, and are electrically connected to each other. A joint 26 extends from an edge of the metal plate 25, and the joint 26 is connected to the N-terminal 34. As such, an assembly 10 in which the pair of the metal plates 12, 15 (the metal plates 22, 25) is connected to the transistor element 3 (the transistor element 5) is completed.

Figure 6:
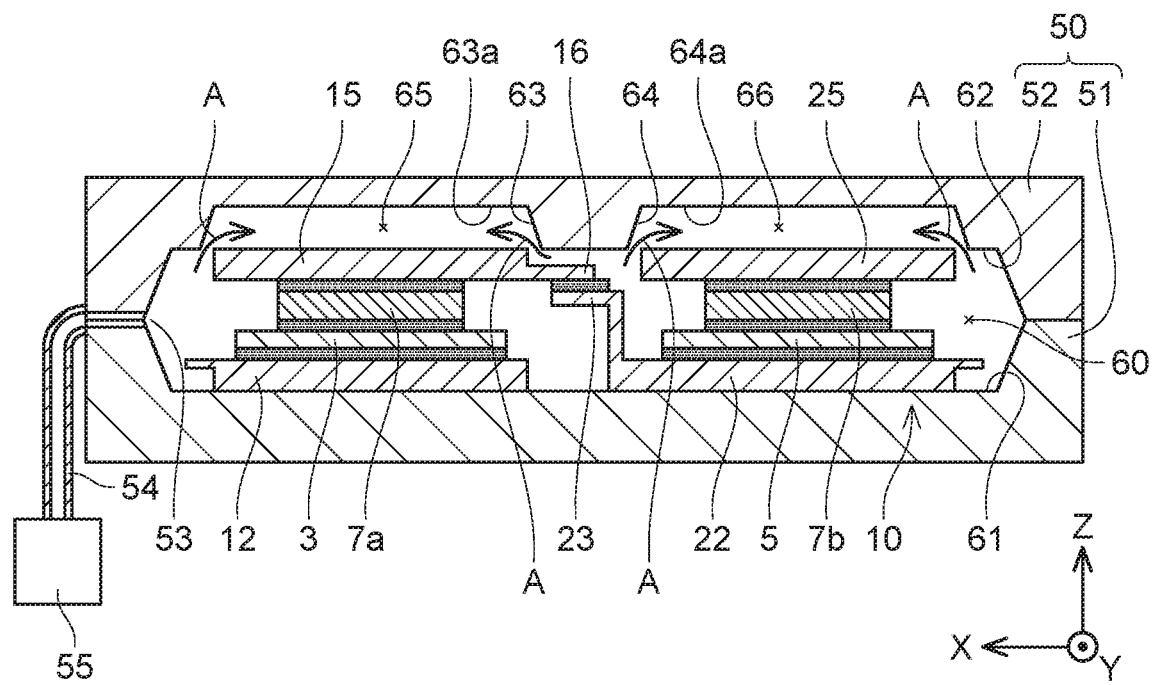
FIG. 6 is a cross sectional view of the assembly 10 and a mold 50 (before resin injection)

(Setting Process) Next, the assembly 10 is set in a cavity 60 of a mold configured to form the package 9. FIG. 6 shows a cross sectional view of a mold 50 and the assembly 10 set in the mold 50. The cross section shown in FIG. 6 corresponds to the cross section shown in FIG. 3. The mold 50 is arranged with its upper side oriented in the positive direction of the Z-axis in the coordinate system in the drawing.

The mold 50 is divided into a lower mold 51 and an upper mold 52. The lower mold 51 is stationary, and the upper mold 52 is movable with respect to the lower mold 51. A movement mechanism of the upper mold 52 is omitted from the drawings. An internal space of the mold 50 corresponds to the cavity 60. A gate 53 configured to guide a molten resin into the cavity 60 is provided at a mating surface between the upper mold 52 and the lower mold 51. A resin supplier 55 is coupled to the gate 53 with a connection pipe 54.

The assembly 10 is set in the cavity 60 of the mold 50. The assembly 10 is set such that the metal plates 12, 22 are in contact with a bottom surface 61 of the cavity 60. An upper surface 62 of the cavity 60 is provided with two recesses 63, 64. The recess 63 is provided in an area of the upper surface 62 that faces the metal plate 15. A bottom surface 63a of the recess 63 is broader than the metal plate 15. In other words, in a normal direction of the metal plate 15 (in the Z-direction), the metal plate 15 is located within a contour of the bottom surface 63a. The recess 64 is provided in an area of the upper surface 62 that faces the metal plate 25. A bottom surface 64a of the recess 64 is broader than the metal plate 25. In other words, in a normal direction of the metal plate 25 (in the Z-direction), the metal plate 25 is located within a contour of the bottom surface 64a. Since the recesses 63, 64 are provided in the upper surface 62 of the cavity 60, "the bottom surfaces of the recesses" are located further above the upper surface 62 of the cavity 60.

A space 65 is ensured above the metal plate 15 by the recess 63. A space 66 is ensured above the metal plate 25 by the recess 64. Each of the spaces 65, 66 is a part of the cavity 60. The assembly 10 is set in the cavity 60 in a state where the lower metal plates 12, 22 are in contact with the bottom surface 61 of the cavity 60, and the upper metal plates 15, 25 are provided with the spaces 65, 66 above them.

(Forming Process) A molten resin is supplied from the resin supplier 55 to the cavity 60. The gate 53 for pouring the molten resin into the cavity 60 is provided at a position lower than heights of the upper metal plates 15, 25. The molten resin supplied from the gate 53 flows to the bottom surface 61 of the cavity 60, and a height of the molten resin is gradually increased. The molten resin flows into the recesses 63, 64 by flowing as shown by arrows A in FIG. 6. A height from the bottom surface 61 of the cavity 60 to the upper surface 62 thereof is substantially equal to a height from the bottom surface 61 of the cavity 60 to the upper metal plates 15, 25, and a flow passage between an edge of the recess 63 (the recess 64) and an edge of the metal plate 15 (the metal plate 25) is narrow. Therefore, the molten resin flows vigorously toward centers of the recesses 63, 64 from around them.

When the high-temperature molten resin contacts the metal plates 12, 15, 22, and 25, the metal plates expand. The spaces 65, 66 are ensured above the metal plates 15, 25, and thus each of these metal plates can expand upward. The first transistor element 3 and the first diode element 4 interposed between the metal plates 12 and 15 are not pressed. The second transistor element 5 and the second diode element 6 interposed between the metal plates 22 and 25 are not pressed, either.

Figure 7:
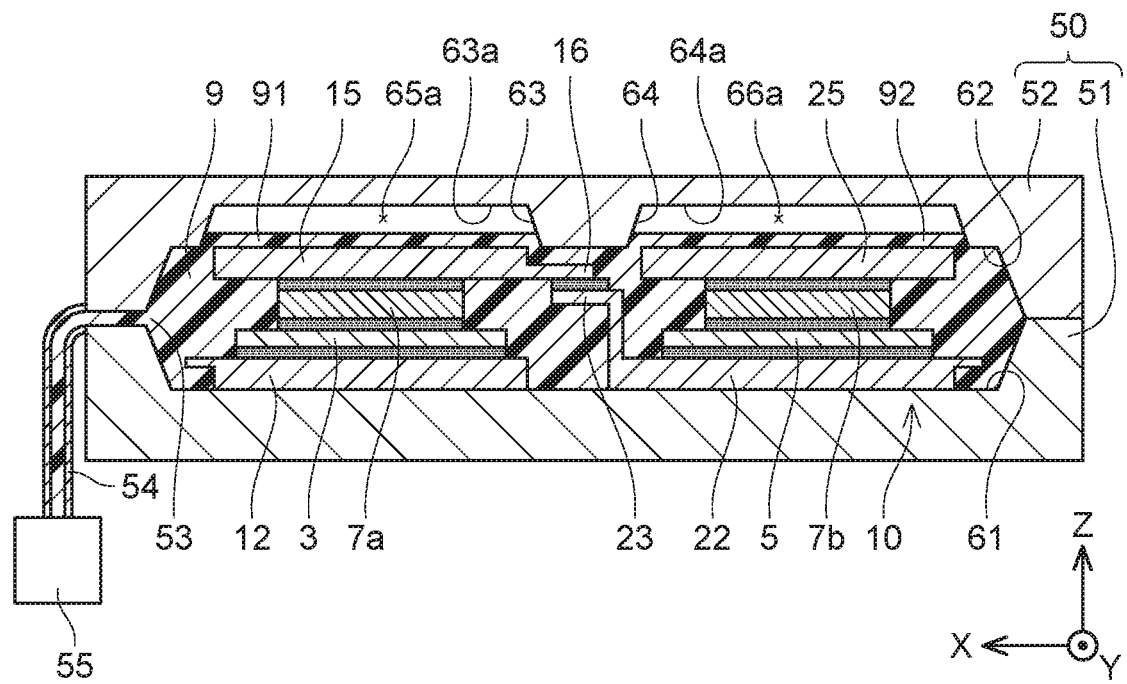
FIG. 7 is the cross sectional view of the assembly 10 and the mold 50 (after resin injection)

FIG. 7 shows a cross sectional view after the molten resin has been injected to the cavity 60. The resin supplier 55 stops supplying the molten resin in a state where the molten resin covers the metal plates 15, 25, and spaces 65a, 66a are left unfilled on an upper side of the cavity 60. The space 65a is a part of the space 65 before the resin injection, and the space 66a is a part of the space 66 before the resin injection. The molten resin enters the recesses 63 and 64. The space 65a is left unfilled on an upper side of an internal space of the recess 63, and the space 66a is left unfilled on an upper side of an internal space of the recess 64. A resin portion 91 that is formed by the molten resin entering the recess 63 covers the metal plate 15. A resin portion 92 that is formed by the molten resin entering the recess 64 coven the metal plate 25.

After stopping the supply of the molten resin, the resin supplier 55 maintains the molten resin in the cavity 60 at a constant pressure. The molten resin hardens as it is, and the package 9 is thereby formed.

Figure 8:
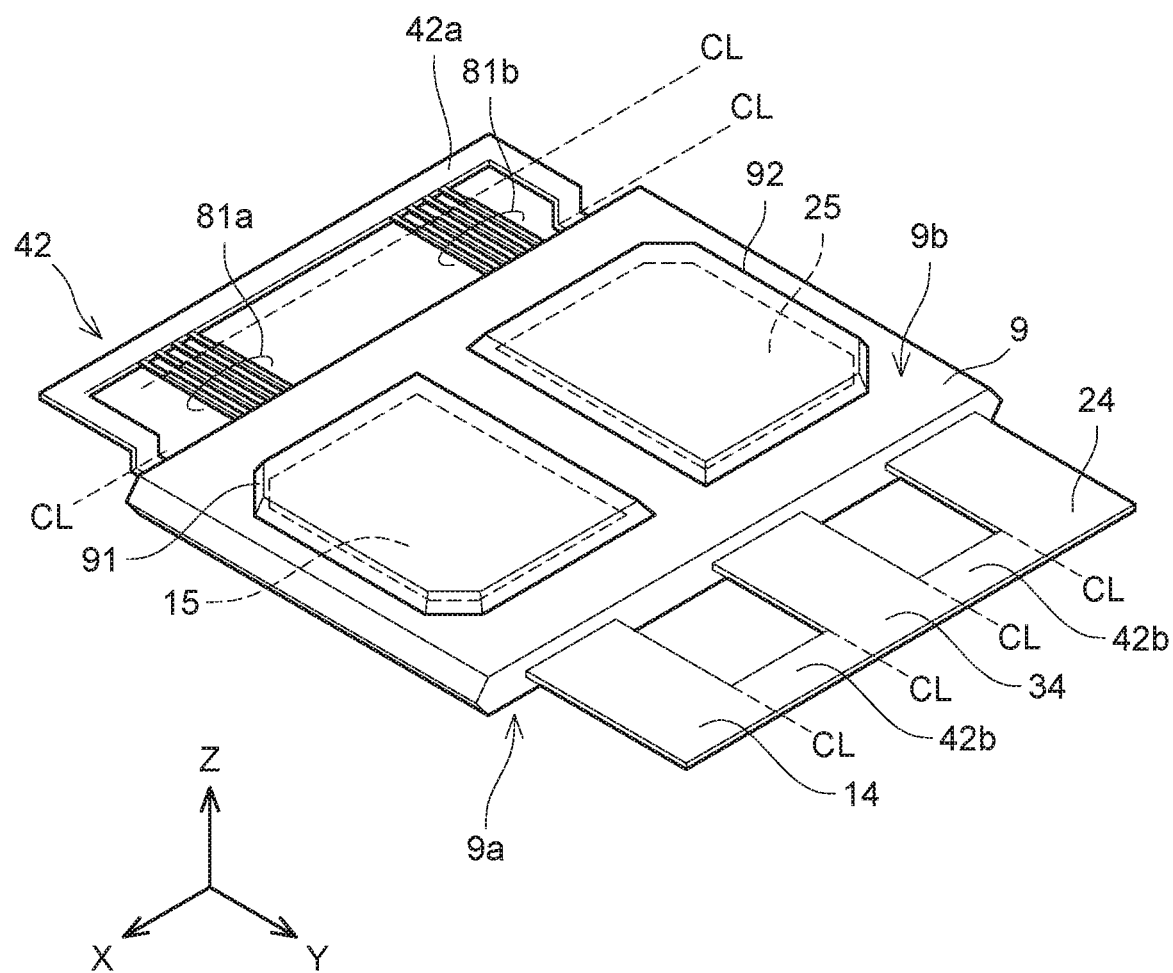
FIG. 8 is a perspective view of the semiconductor device 2 before resin removal.

(Removing Process) The package 9 sealing the first transistor element 3, the first diode element 4, the second transistor element 5, and the second diode element 6 therein is extracted from the mold 50, and the resin portions 91, 92 covering the metal plates 15, 25 are removed. FIG. 8 is a perspective view of the package 9 before the resin portions 91, 92 are removed. The metal plate 15 is completely covered by the resin portion 91. The metal plate 25 is completely covered by the resin portion 92.

Figure 9:
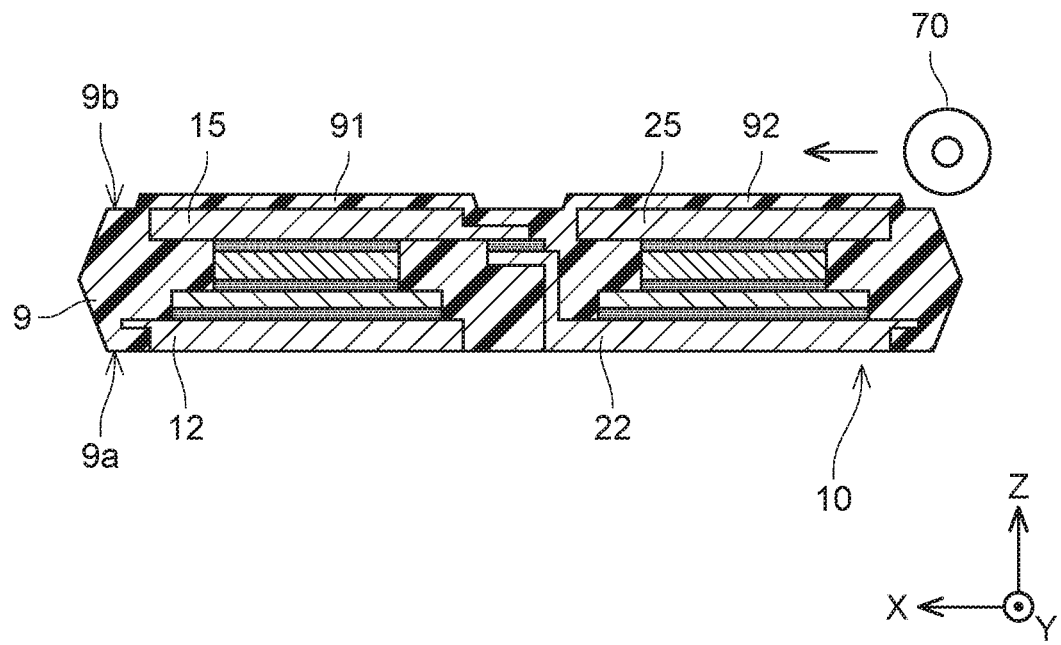
FIG. 9 is a diagram for explaining a resin removal process.

FIG. 9 schematically shows the process of removing the resin portions 91, 92. A cross section shown in FIG. 9 corresponds to the cross section of the package 9 in FIG. 7. The resin portions 91, 92 covering the metal plates 15, 25 are removed by being cut with a cutting tool 70. Surfaces of the metal plates 15, 25 are made to be flush with the surface 9b of the package 9 with high accuracy by this cutting. Since the lower metal plates 12, 22 were in contact with the lower mold 51, the metal plates 12, 22 are exposed at the lower surface of the package 9. Since the package 9 is formed with the metal plates 12, 22 being in contact with the bottom surface 61 of the cavity 60, the surface 9a of the package 9 is flush with surfaces of the metal plates 12, 22.

After the resin portions 91, 92 have been removed, the runner portions 42a, 42b of the lead frame 42 are removed, along broken lines CL in FIG. 8. As such, the semiconductor device 2 shown in FIG. 1 is completed.

Advantages of the manufacturing method described in the embodiment will be described. In the manufacturing method of the embodiment, the injection of molten resin is stopped in the state where the metal plates 15, 25 are covered by the resin (the resin portions 91, 92) and the spaces 65a, 66a are left unfilled above the resin (the resin portions 91, 92). Since an upper surface of the molten resin is in contact with the spaces, the molten resin has high fluidity in the cavity 60. Although the molten resin may include gas bubbles therein, the gas bubbles are moved and discharged from a gas releasing hole (air vent) because the molten resin has the high fluidity. Alternatively, the gas bubbles escape into the spaces 65a, 66a above the resin portions 91, 92.

The recess 63 (the recess 64) is provided in the area of the upper surface 62 that faces the metal plate 15 (the metal plate 25). The gap between the edge of the recess 63 (the recess 64) and the edge of the metal plate 15 (the metal plate 25) is narrow, and the molten resin flows through the gap vigorously. At this occasion, gas bubbles in the molten resin are pushed out to the recess 63 (the recess 64). The gas bubbles are removed together with the resin portions 91, 92 in the recesses 63, 64, and thus they do not remain in the package 9. In the above-described manufacturing method, gas bubbles are less likely to remain in the package 9.

An additional effect that reduces an amount of resin to be removed later can further be obtained by providing the recesses 63, 64 in the upper surface 62 of the cavity 60, and allowing the molten resin to flow therein upon forming the package 9. A metallic filler may be mixed in the resin to enhance thermal conductivity. The metallic filler abrades the cutting tool 70. By reducing the amount of resin to be removed, a life of the cutting tool 70 can be extended.

(First Variant) A first variant of the manufacturing method of the embodiment will be described with reference to FIGS.

Figure 10:
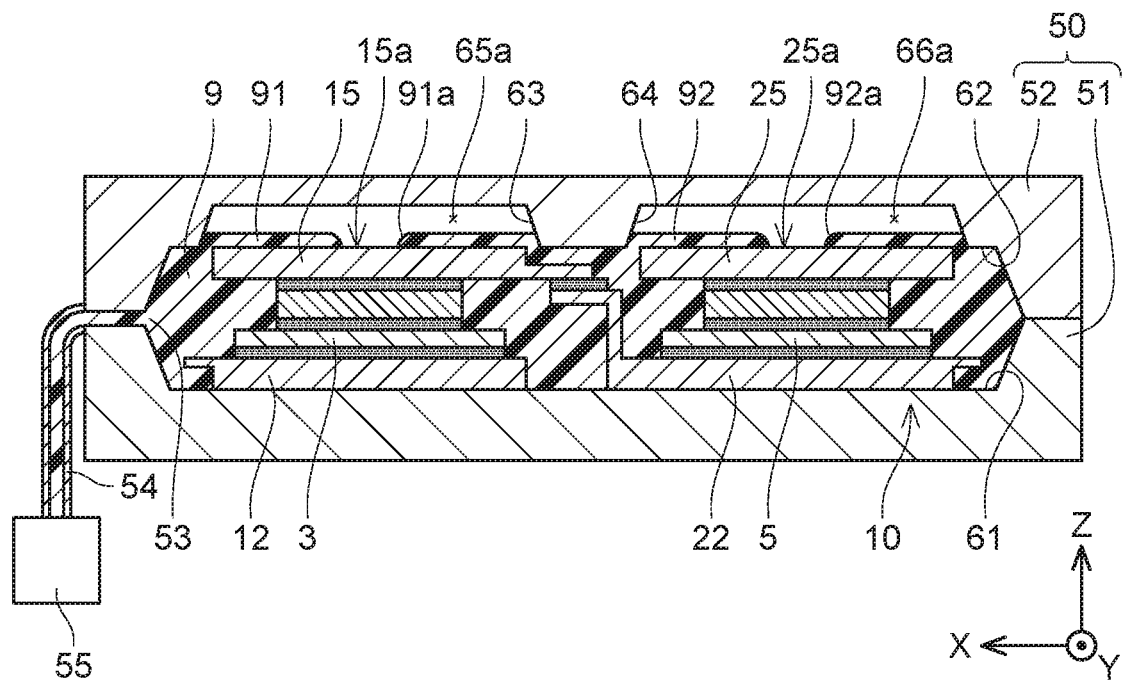
FIG. 10 is a cross sectional view for explaining a manufacturing method of a first variant.
Figure 11:
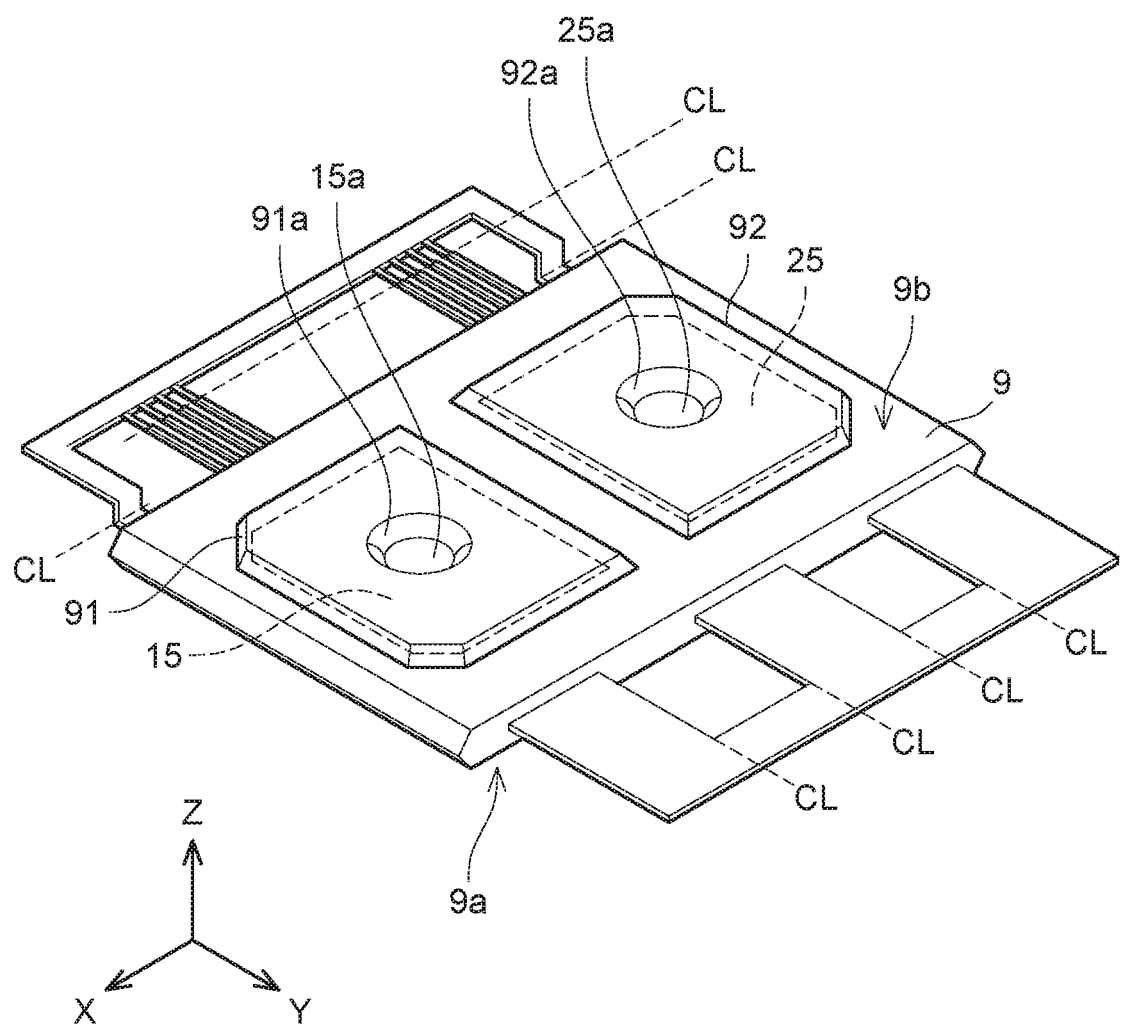
FIG. 11 is a perspective view of a semiconductor device according to the manufacturing method of the first variant, before resin removal.

10 and 11. FIG. 10 corresponds to FIG. 7, and FIG. 11 corresponds to FIG. 8. The molten resin has fluidity but it also has viscosity. As aforementioned, the gate 53 for guiding the molten resin into the cavity 60 is provided at the mating surface between the upper mold 52 and the lower mold 51. In other words, the gate 53 is provided at a position lower than the upper metal plates 15, 25. The molten resin gradually increases its height in the cavity 60, and starts to cover the metal plates 15, 25 from around them. Upon injecting the molten resin into the cavity 60, an amount of the molten resin to be injected is adjusted so that exposed portions 15a, 25a remain in centers of the upper metal plates 15, 25 and the resin portions 91, 92 cover peripheries of the metal plates 15, 25. Although the molten resin flows toward the centers of the metal plates 15, 25 from the peripheries thereof, it stops moving before reaching the centers of the metal plates due to its viscosity when the amount of the molten resin is small. A hole 91a is formed in a center of the resin portion 91 covering the upper metal plate 15, and the exposed portion 15a of the metal plate 15 is formed within the hole 91a. A hole 92a is formed in a center of the resin portion 92 covering the upper metal plate 25, and the exposed portion 25a of the metal plate 25 is formed within the hole 92a.

So long as the edges of the metal plates 15, 25 are covered by the resin, the metal plates 15, 25 and the package 9 can be made to be flush with each other in the cutting to be performed thereafter. The amount of resin to be cut can be further reduced by adjusting the amount of the molten resin so that a part of each upper metal plate 15, 25 is exposed.

Figure 12:
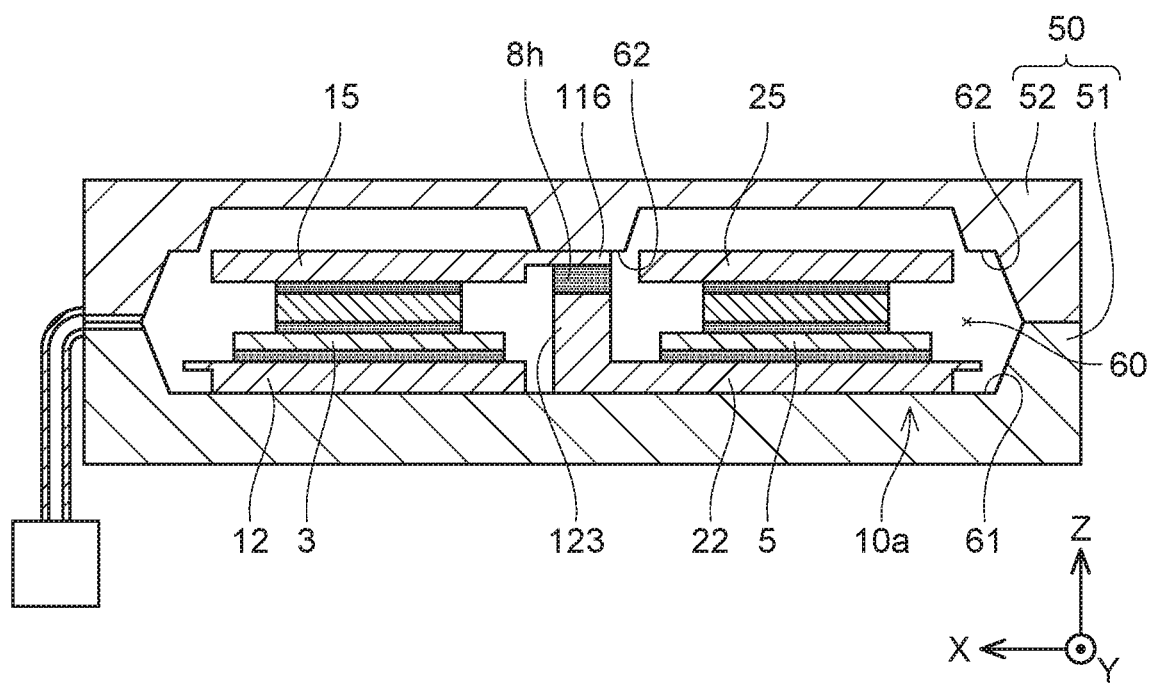
FIG. 12 is a cross sectional view for explaining a manufacturing method of a second variant.

(Second Variant) A second variant will be described with reference to FIG. 12. FIG. 12 corresponds to FIG. 7. In the second variant, a configuration of an assembly 10a constituted of semiconductor elements and metal plates is different from that of the assembly 10 of the embodiment. The assembly 10a includes two pairs of metal plates (the metal plates 12, 15, and the metal plates 22, 25), each of which interposes a semiconductor element therebetween. The lower metal plate 22 of one pair of the two pairs includes a joint 123 extending from its edge, and the upper metal plate 15 of the other pair of the two pairs includes a joint 116 extending from its edge. In the normal direction of the metal plate 15, the both joints 116, 123 overlap each other. The joints 116, 123 are connected by a solder layer 8h. A surface of the joint 116 is flush with the surface of the metal plate 15, and a surface of the joint 123 is flush with the surface of the metal plate 22. Accordingly, in the cavity 60, the upper joint 116 is in contact with the upper surface 62 of the cavity 60. A metal portion constituted of the joints 116, 123 and the solder layer 8h is interposed between the bottom surface 61 of the cavity 60 and the upper surface 62 thereof. Thus, the assembly 10a is firmly held in the cavity 60. The assembly 10a is not moved when the molten resin is injected. As understood from FIG. 8, the assembly 10 (the assembly 10a) has the P-terminal 14, the O-terminal 24, the N-terminal 34, and the control terminals 81a, 81b interposed between the molds. Thus, even if the joints 116, 123 are not interposed between the bottom surface 61 of the cavity and the upper surface 62 thereof, the assembly 10 is firmly held by the mold 50. However, when the joints 116, 123 are interposed between the bottom surface 61 of the cavity 60 and the upper surface 62 thereof, the assembly 10a is more firmly held in the mold 50.

Points to note regarding the technique described in the embodiment will be described. The semiconductor device 2 of the embodiment comprises the two metal plates 15, 25 on one surface thereof. The mold 50 configured to form the package 9 is provided with the recesses 63, 64 respectively corresponding to the metal plates 15, 25 in the upper surface 62 of the cavity 60. The upper surface of the cavity may be provided with a plurality of recesses respectively facing a plurality of metal plates, or may be provided with a single recess facing a plurality of metal plates.

The height from the bottom surface 61 of the cavity 60 to the upper surface thereof may be substantially equal to the height from the bottom surface 61 to the surfaces of the upper metal plates 15, 25. However, the upper surface 62 may be positioned above the metal plates 15, 25.

The semiconductor device 2 comprises two pairs of metal plates, each of which interposes a semiconductor element therebetween. The technique disclosed herein may be adopted to a method of manufacturing a semiconductor device that comprises only one pair of metal plates interposing a semiconductor element therebetween.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A method of manufacturing a semiconductor device that comprises a resin package sealing a semiconductor element and a pair of metal plates interposing the semiconductor element therebetween, each of the pair of metal plates being exposed at corresponding one of both surfaces of the resin package, the method comprising:
    preparing an assembly in which the semiconductor element is connected to the pair of metal plates;
    setting the assembly in a cavity of a mold configured to form the resin package, wherein one metal plate of the pair of metal plates is in contact with a bottom surface of the cavity and a space is provided above the other metal plate of the pair of metal plates;
    forming the resin package by injecting a molten resin into the cavity so as to cover an upper side of the other metal plate, stopping the injecting of the molten resin with a part of the space on an upper side of the cavity unfilled, and hardening the molten resin injected into the cavity; and
    removing a resin covering the other metal plate.

2. The method as in claim 1, wherein
    a recess is provided in an area of an upper surface of the cavity, the area facing the other metal plate, and
    the forming of the resin package comprises stopping the injecting of the molten resin with a part of an inner space of the recess unfilled.

3. The method as in claim 1, wherein
    the assembly comprises two pairs of metal plates, each of the two pairs of metal plates interposing a semiconductor element therebetween,
    a first joint extends from an edge of a lower metal plate of one pair of the two pairs of metal plates,
    a second joint extends from an edge of an upper metal plate of the other pair of the two pairs of metal plates, the first joint and the second joint overlap each other in a normal direction of the metal plates, and the first joint and the second joint are connected to each other via a solder, and in the cavity, the second joint is in contact with an upper surface of the cavity.

* * * * *